United States Patent
Motomatsu (10) Patent No.: US 6,541,909 B1
(45) Date of Patent: Apr. 1, 2003

(54) ORGANIC ELECTROLUMINESCENT DEVICE WITH DOPED TRANSPORT LAYER(S) AND PRODUCTION METHOD

(75) Inventor: Toshihiko Motomatsu, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/517,145

(22) Filed: Mar. 2, 2000

(30) Foreign Application Priority Data

Mar. 2, 1999 (JP) .............................. 11-054611

(51) Int. Cl.$^7$ .......................... H05B 33/14; H05B 33/18
(52) U.S. Cl. .................. 313/504; 313/506; 428/917
(58) Field of Search ................... 313/504, 506; 428/917; 427/66

(56) References Cited

U.S. PATENT DOCUMENTS 6,303,238 B1 * 10/2001 Thompson et al. ......... 428/917
6,413,656 B1 *  7/2002 Thompson et al. ......... 428/917
6,458,475 B1 * 10/2002 Adachi et al. ............. 428/917

FOREIGN PATENT DOCUMENTS

| JP | 8-315982 | 11/1996 |
| JP | 10-231476 | 9/1998 |
| JP | 10-231477 | 9/1998 |
| JP | 10-231478 | 9/1998 |

* cited by examiner

*Primary Examiner*—Michael H. Day
(74) *Attorney, Agent, or Firm*—Katten Muchin Zavis Rosenman (57) ABSTRACT

An organic electroluminescent display is provided, which can sufficiently control a change of a shade by luminescence of an electron transport layer or a hole transport layer itself, and can always hold a stable chromaticity, and a production method of the same, and an organic electroluminescent display. On a glass substrate is formed a transparent electrode composed of ITO (Indium-Tin-Oxide) as an anode. In addition, on the anode is formed an organic EL layer composed of a hole transport layer which transports a hole, a luminescent layer which emits light by a combination between a hole and an electron, and an electron transport layer which transports an electron. Further, on the electron transport layer is formed a cathode. A doped layer is formed, by doping the same kind of dopant as that doped into the luminescent layer in a lower concentration than in the luminescent layer, in at least one of luminescent layer side regions, where the hole transport layer and the electron transport layer contact the luminescent layer respectively.

25 Claims, 5 Drawing Sheets

ORGANIC ELECTROLUMINESCENT DEVICE WITH DOPED TRANSPORT LAYER(S) AND PRODUCTION METHOD

BACKGROUND OF THE INVENTION

1. Field of the Invention

The present invention relates to an organic electroluminescent element used in a display or the like, a production method of the same, and an organic electroluminescent display. More particularly, the present invention relates to an organic electroluminescent element in which a change of a shade is controlled, a production method of the same, and an organic electroluminescent display.

2. Description of the Related Art

Figure 1:
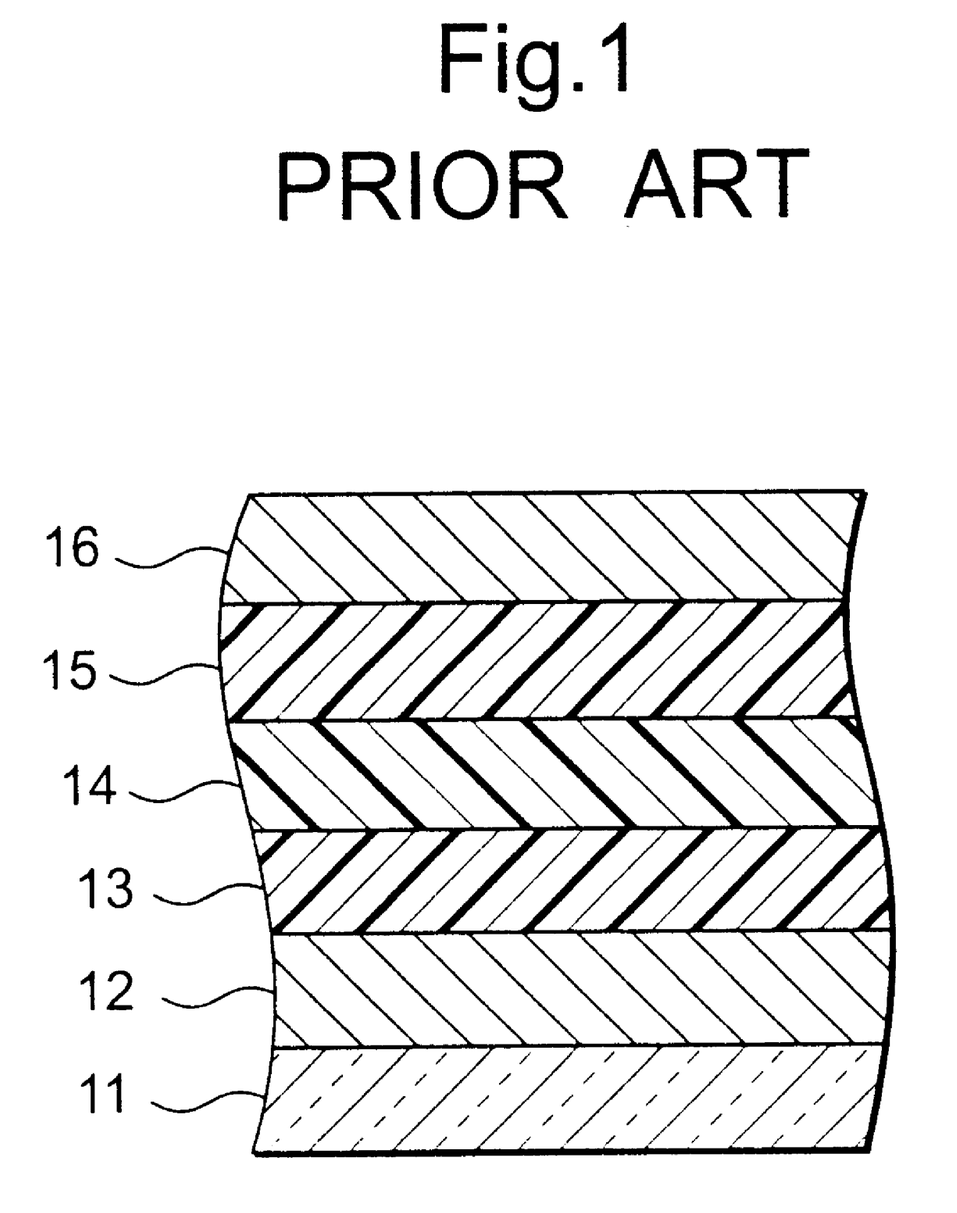
FIG. 1 is a cross-sectional view showing a conventional organic EL element.

In an organic electroluminescent (EL) device, a layer formed by doping a guest material (dopant) to a host material in an aimed concentration has been used as a luminescent layer to obtain a practical level of chromaticity. FIG. 1 is a cross-sectional view showing a conventional organic EL element.

In the conventional organic EL element, on a glass substrate 11 is formed a transparent electrode composed of ITO (Indium-Tin-Oxide) as an anode 12. Further, on the anode 12 is formed an organic EL layer composed of a hole transport layer 13 which transports a hole, a luminescent layer 14 which emits light by a recombination between a hole and an electron, and an electron transport layer 15 which transports an electron. Further, on the electron transport layer 15 is formed a cathode 16. A guest material is doped into the luminescent layer 14 in a predetermined concentration.

In the thus formed conventional organic EL element, a hole or an electron penetrates the luminescent layer due to the relation of an applied voltage so that a change of carrier balance can possibly occur. Therefore, a recombination between a hole and an electron occurs in the electron transport layer or the hole transport layer so that the electron transport layer or the hole transport layer emits light, whereby a shade is undesirably changed.

Japanese Patent Application Laid-Open No. Hei 8-315982 discloses an organic EL element that can generate a plurality of color tones in accordance with an applied voltage to prevent a change of a shade. In the organic EL device described in this publication, an aluminum complex is used in the luminescent layer or the electron transport layer. And the electron transport layer (or fluorescent dyes doped into the electron transport layer) is light-emitted at a low applied voltage, on the other hand, the hole transport layer (or fluorescent dyes doped into the hole transport layer) is light-emitted at a high applied voltage.

Further, Japanese Patent Application Laid-Open Nos. Hei 10-231476, 10-231477, and 10-231478 disclose an organic EL element provided with a hole blocking layer between an organic luminescent layer and a cathode. In the organic EL element described in these publications, a triazole compound is used as a hole blocking material. Further, these publications describe that dopants are doped in the hole transport layer to obtain a higher luminescence efficiency and an excellent heat resistance.

However, the conventional organic EL element described in Japanese Patent Application Laid-Open No. Hei 8-315982 has a problem in that when luminescence is performed in the electron transport layer or hole transport layer the emitted colors are not the same as those of the luminescent layer.

Further, even if a hole blocking layer is provided to increase the luminescence efficiency like the conventional organic EL element described in Japanese Patent Application Laid-Open No. Hei 10-231476 and the like, holes that penetrate the luminescent layer and are blocked with the blocking layer don't have a significant ratio that contributes to the luminescence. Accordingly, the conventional organic EL element cannot control a change of a shade. If a dopant was doped in the hole transport layer, there are some cases which a change of a shade can be controlled. However, only doping of the dopant cannot stably control such a change.

As explained above, the luminescence of the electron transport layer or the hole transport layer itself by the hole or electron, which penetrates the luminescent layer, cannot be sufficiently controlled even by these conventional examples.

SUMMARY OF THE INVENTION

An object of the present invention is to provide an organic electroluminescent element, which can sufficiently control a change of a shade by luminescence of an electron transport layer or a hole transport layer itself, and can always hold a stable chromaticity, and a production method of the same, and an organic electroluminescent display.

An organic electroluminescent element according to the present invention, comprising a dopant-doped luminescent layer that emits light by a recombination between a hole and an electron, a hole transport layer that transports a hole supplied from an anode to the luminescent layer, and an electron transport layer that transports an electron supplied from a cathode to the luminescent layer, is characterized in that the same kind of dopant as that of the dopant is doped in the region, where at least one of the hole transport layer and the electron transport layer contacts the luminescent layer, in a lower concentration than the concentration in the luminescent layer.

According to the present invention, since the same kind of dopant as that of the dopant in the luminescent layer is doped in the region, where at least one of the hole transport layer and the electron transport layer contacts the luminescent layer, in a lower concentration than the concentration in the luminescent layer, when a recombination between the hole and the electron is generated in at least one of the hole transport layer and the electron transport layer, luminescence is performed in a dopant-doped region. As a result, even if at least one of the electron and the hole penetrates the luminescent layer due to the relation of an applied voltage, the current efficiency is not lowered and the luminescence in the hole transport layer and the electron transport layer is controlled. Thus, a change of a shade is stably controlled.

Note that it is preferable that the thickness of a region where the dopant is doped into at least one of the hole transport layer and the electron transport layer is $2/3$ or less of the thickness of one of the hole transport layer and the electron transport layer or of both thickness thereof. This reason is that a too thick doped layer causes reduction in a doping efficiency, and on the other hand, a too thin doped layer causes a small control effect on a change of a shade. Accordingly, by designing the thickness of the doped region to $2/3$ or less of the thickness of one of the hole transport layer and the electron transport layer or of both thickness thereof, an excellent doping efficiency and the control effect on a change of a shade can be obtained.

A method of producing an organic electroluminescent element according to the present invention, comprising the steps of forming a hole transport layer that transports a hole supplied from an anode, forming a dopant-doped luminescent layer that emits light by a recombination between a hole transported from the hole transport layer and an electron transported from the hole transport layer, and forming an electron transport layer that transports an electron supplied from a cathode to the luminescent layer, is characterized in that the step of forming at least one of the hole transport layer and the electron transport layer includes a step of doping the same kind of dopant as that of the dopant in a region, where at least one of the hole transport layer and the electron transport layer contacts the luminescent layer, in a lower concentration than the concentration in the luminescent layer.

According to the present invention, since the same kind of dopant as that of the dopant in the luminescent layer is doped in the region, where at least one of the hole transport layer and the electron transport layer contacts the luminescent layer, in a lower concentration than the concentration in the luminescent layer, a change of a shade is stably controlled as described above.

Further, it is preferable that the thickness of the region where the dopant is doped into at least one of the transport layer and the electron transport layer is ⅔ or less of the thickness of one of the hole transport layer and the electron transport layer or of both thickness thereof. This reason is that a too thick doped-layer causes reduction in a doping efficiency, and on the other hand, a too thin doped-layer causes a small control effect on a change of a shade. Accordingly, by designing the thickness of the doped region to ⅔ or less of the thickness of one of the hole transport layer and the electron transport layer or of both thickness thereof, an excellent doping efficiency and the control effect on a change of a shade can be obtained.

Further, an organic electroluminescent display according to the present invention is characterized in that the above-mentioned organic electroluminescent element is mounted.

DETAILED DESCRIPTION OF THE PREFERRED EMBODIMENTS

Figure 2:
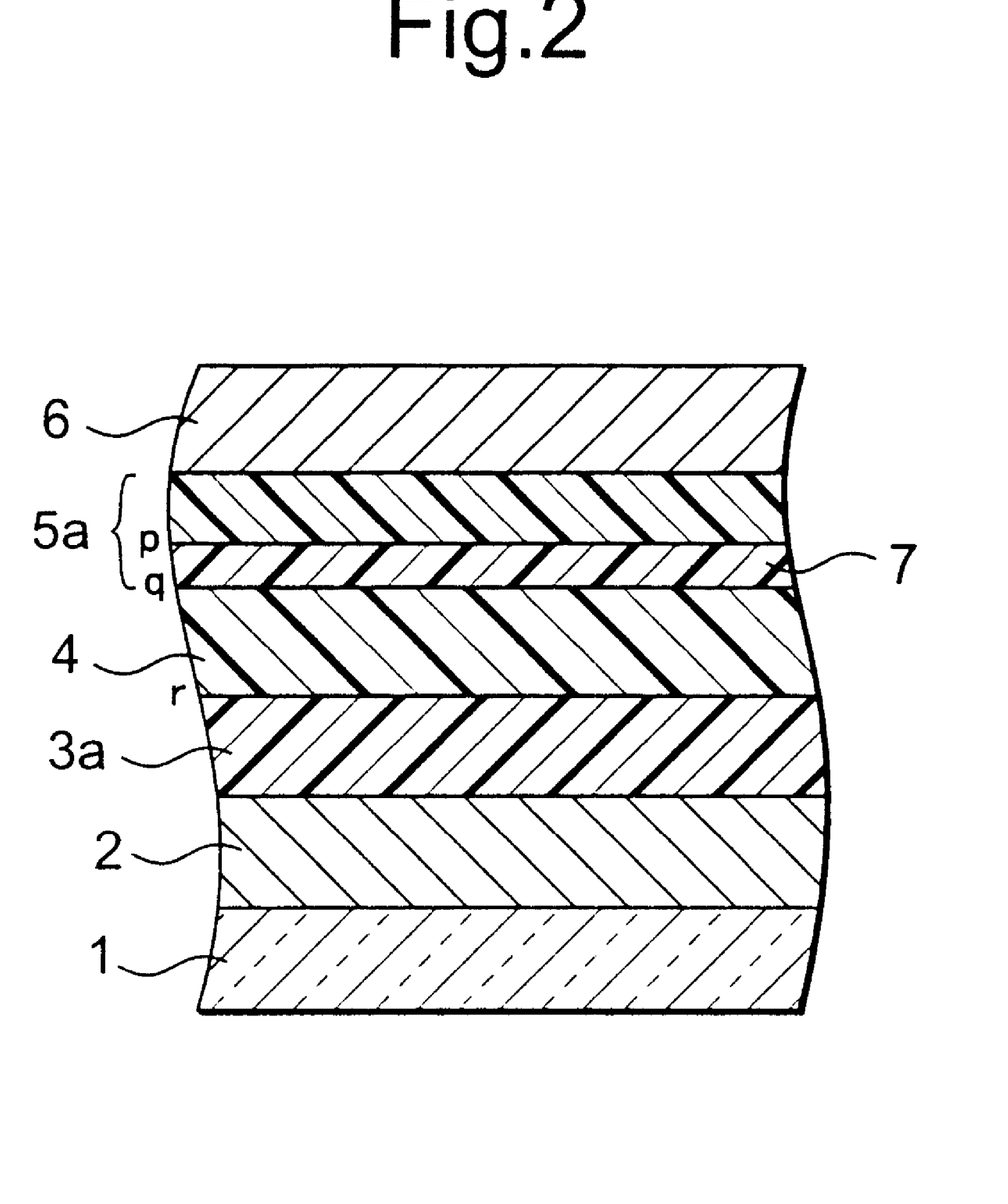
FIG. 2 is a cross-sectional view showing an organic EL element according to a first embodiment of the present invention.

An organic electroluminescent (EL) element according to embodiments of the present invention will be described in detail with reference to the attached drawings below. FIG. 2 is a cross-sectional view showing an organic EL element according to a first embodiment of the present invention.

In the organic EL element according to the first embodiment, on a glass substrate 1 is formed a transparent electrode composed of ITO (Indium-Tin-Oxide) as an anode 2. Further, on the anode 2 is formed an organic EL layer composed of a hole transport layer 3a which transports a hole, a luminescent layer 4 which emits light by a combination between a hole and an electron, and an electron transport layer 5a which transports an electron. Further, on the electron transport layer 5a is formed a cathode 6.

In the present embodiment, a doped layer 7 is formed, by doping the same kind of dopant as that doped into the luminescent layer 4 in a lower concentration than in the luminescent layer 4, in a luminescent layer side region, where the electron transport layer 5a contacts the luminescent layer 4. That is, the electron transport layer 5a includes the doped layer 7 that contains dopant on the luminescent layer 4 side and an electron transport material independent layer that does not contain dopant on the cathode 6 side. In this case, the doped amount is controlled by the rate of vapor deposition. Doped amounts in the luminescent layer 4 and the electron transport layer are different depending on materials used and are not specifically limited. However, it is preferable that a doped amount in the luminescent layer 4 is in a range of 1 to 10% by volume, and a doped amount in the doped layer 7 is in a range of about 0.6 to 6% by volume. As one example, when the doped amount in the luminescent layer 4 was set to 5%, a doped amount in the region where the electron transport layer 5a contacts the luminescent layer 4, or the doped layer 7, was set to 3%. In this embodiment, the thickness of each component was as follows. That is, the thickness of the glass substrate 1 was 1.1 mm, the thickness of the anode 2 was 250 nm, the thickness of the hole transport layer 3a was 50 nm, the thickness of the luminescent layer 4 was 50 nm, the thickness of the electron transport layer 5a was 40 nm, the thickness of the cathode 6 was 100 nm, and the thickness of the doped layer 7 that is formed in the electron transport layer 5a was 15 nm.

In the thus formed first embodiment, the same kind of dopant as that of the luminescent layer 4 is doped into the doped layer 7 of the electron transport layer 5a in a low concentration. Accordingly, the doped layer 7 also functions as a hole blocking layer. Therefore, when an recombination between a hole and an electron is generated in the electron transport layer 5a, luminescence is generated in the doped layer 7. As a result, even if a hole penetrates the luminescent layer 4 due to the relation of an applied voltage, the current efficiency is not lowered and luminescence of the electron transport layer 5a itself is controlled, whereby a change of a shade can be stably controlled.

That is, even if a carrier balance between the hole and the electron is changed due to the relation of an applied voltage, a change of a shade is controlled. Accordingly, the color purity of the organic EL element is stabilized to thereby obtain a long reliability.

Additionally, it is preferable that the thickness of the doped layer 7 into which the same kind of dopant as that of the electron transport layer 5a is doped is ⅔ or less of the thickness of the electron transport layer 5a to prevent the reduction of doping efficiency. If the thickness of the doped layer is larger than ⅔ of the thickness of the electron transport layer 5a, a luminance of the organic EL element is decreased by about 20%.

Then, a method of producing the above-mentioned organic EL element will be described.

On a glass substrate 1 is first formed a transparent electrode composed of ITO (Indium-Tin oxide) as an anode 2. Then, on this anode 2 is formed an organic EL layer by sequentially forming a hole transport layer 3a which transports a hole, a luminescent layer 4 that emits light by an recombination between a hole and an electron, and an electron transport layer 5a which transports an electron. In this formation of the organic EL layer, after the formation of the luminescent layer 4, a doped layer 7 is formed by vapor deposition of both electron transport material and the same kind of dopant as that used in the luminescent layer 4, and the electron transport layer 5a is subsequently formed by vapor deposition of only the electron transport material.

Figure 3:
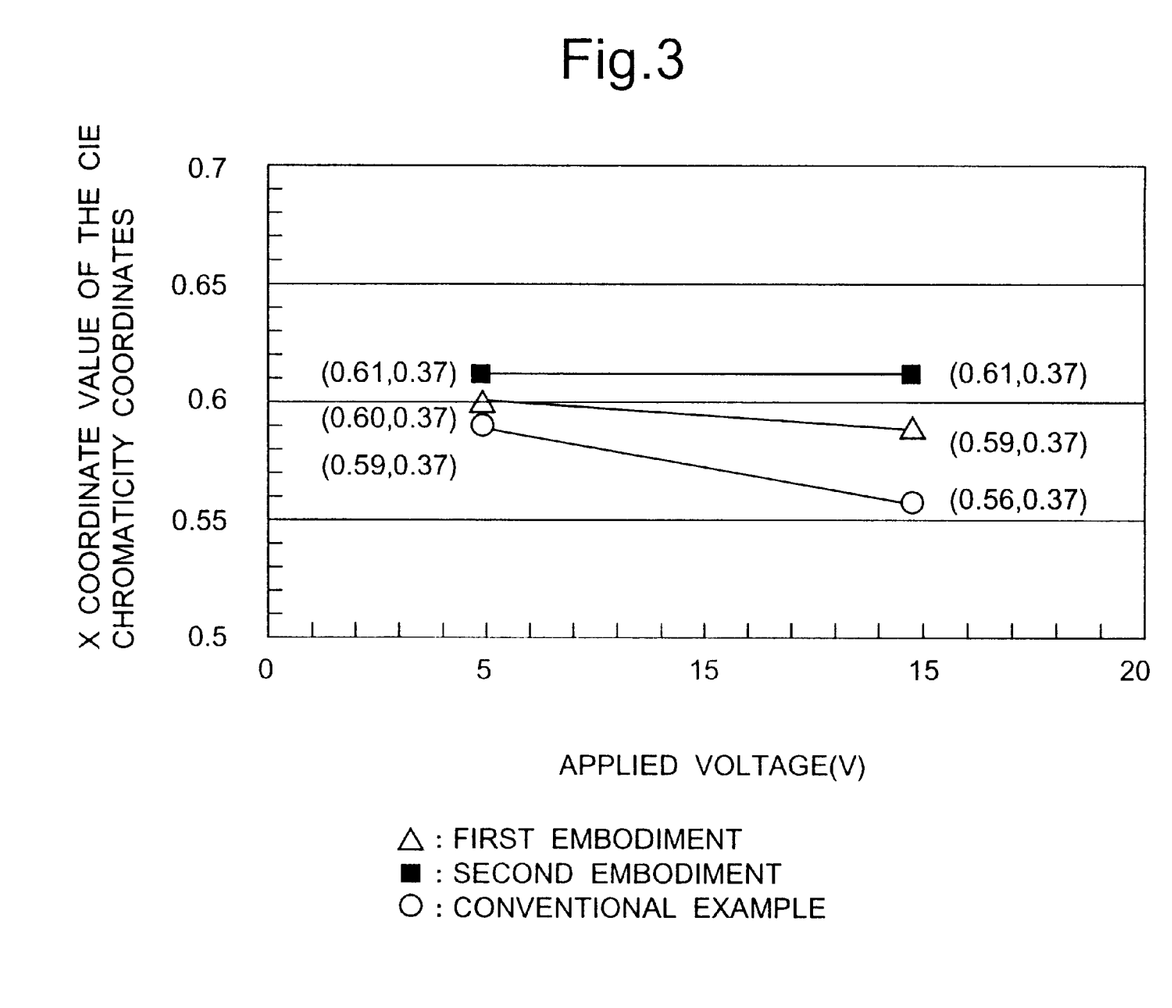
FIG. 3 is a graph showing a relationship between applied voltages and the X coordinate of CIE chromaticity coordinate of various organic EL elements.

Then, a change of a shade in the organic EL element actually produced by the above-mentioned method will be described. FIG. 3 is a graph showing a relationship between applied voltages on the abscissa and the X coordinate of CIE chromaticity coordinate on the ordinate of various organic EL elements. In FIG. 3, an example in which the doped layer 7, which functions as a hole blocking layer, is formed by doping a dopant in the luminescent layer side region of the electron transport layer 5a is shown by a mark Δ as a first embodiment of the present invention. Further, an example having a thicker doped layer than in the first embodiment is shown by a mark ♦ as a second embodiment of the present invention. On the other hand, an example in which a dopant was not doped into the electron transport layer and the hole transport layer is shown by a mark ○ as a conventional example. Two numerical values of the point of the mark in FIG. 3 are values of the X coordinate and Y coordinate of the CIE chromaticity coordinates.

As shown in FIG. 3, even if an applied voltage is increased, a change of a shade in the first embodiment is further controlled or held than in the conventional example. Further, when the first embodiment is compared with the second embodiment, a change of a shade is further controlled in the second embodiment having a thicker doped layer.

Figure 4:
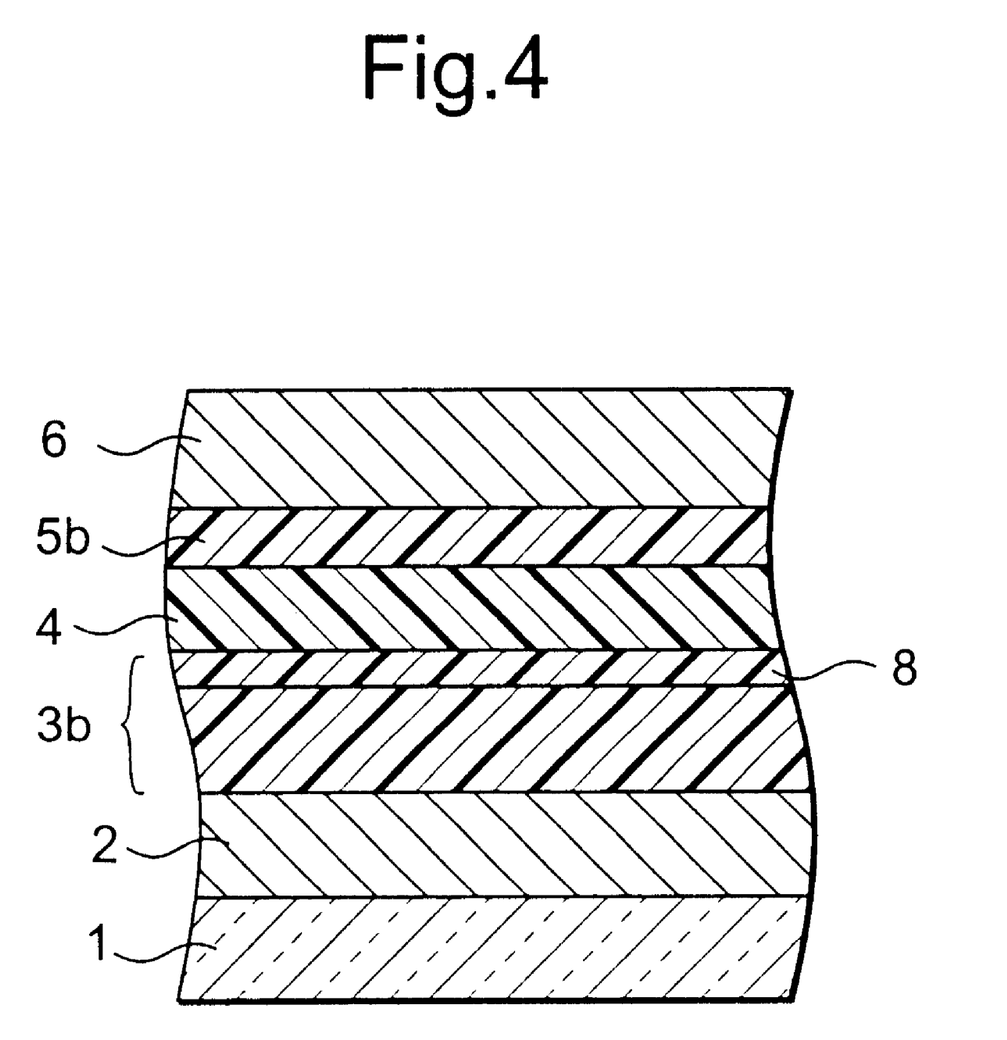
FIG. 4 is a cross-sectional view showing an organic EL element according to a second embodiment of the present invention.

The present invention is not limited to the above-mentioned embodiments. In the present invention an example in which a doped layer is formed in a luminescent layer side region where the hole transport layer contacts the luminescent layer, may be used. FIG. 4 is a cross-sectional view showing an organic EL element according to a third embodiment of the present invention. In the third embodiment shown in FIG. 4, the same components as those in the first embodiment are denoted by the same reference numerals and the detailed descriptions of the components are omitted.

In the third embodiment, on an anode 2 is formed a hole transport layer 3b. Further, a doped layer 8 is formed, by doping the same kind of dopant as that doped into the luminescent layer 4 in a lower concentration than in the luminescent layer 4, in a luminescent layer side region, where the hole transport layer 3b contacts the luminescent layer 4. This doping is performed by simultaneous vapor deposition in the same manner as in the formation of the doped layer 7 in the first embodiment. That is, after the formation of the anode 2, the hole transport layer 3b is formed by forming an hole transport material independent layer and forming the doped layer 8 obtained by simultaneous vapor deposition of the hole transport material and a dopant. On the other hand, a doped layer is not formed in the electron transport layer 5b. Doped amounts in the luminescent layer 4 and the hole transport layer are different depending on materials used and are not specifically limited. However, it is preferable that a doped amount in the luminescent layer 4 is in a range of 1 to 10% by volume, and a doped amount in the hole transport layer is in a range of about 0.6 to 6% by volume. As one example, when the doped amount in the luminescent layer was set to 5%, a doped amount in a region where the electron transport layer contacts the luminescent layer was set to 3%.

In the thus formed third embodiment, the same kind of dopant as that of the luminescent layer 4 is doped into the doped layer 8 of the hole transport layer 3b in a low concentration. Accordingly, the doped layer 8 also functions as an electron blocking layer. Therefore, when a recombination between a hole and an electron is generated in the hole transport layer 3b, luminescence is generated in the doped layer 8. As a result, even if an electron penetrates the luminescent layer 4 due to the relation of an applied voltage, the current efficiency is not lowered and luminescence of the hole transport layer 3b itself is controlled, whereby a change of a shade can be stably controlled.

Additionally, it is preferable that the thickness of the doped layer 8 is ⅔ of the thickness of the hole transport layer 3b by the same reason as in the first embodiment.

Although a doped layer is provided only in the luminescent layer side region in one of the electron transport layer and the hole transport layer in these first, second and third embodiments, the doped layer can be provided in the luminescent layer side regions in both the electron transport layer and the hole transport layer. Even in this case, a concentration of the dopant in the doped layer must be set to a lower level than in the luminescent layer, and the thickness of the doped layer is preferably ⅔ or less of each thickness of the electron transport layer and the hole transport layer.

Figure 5:
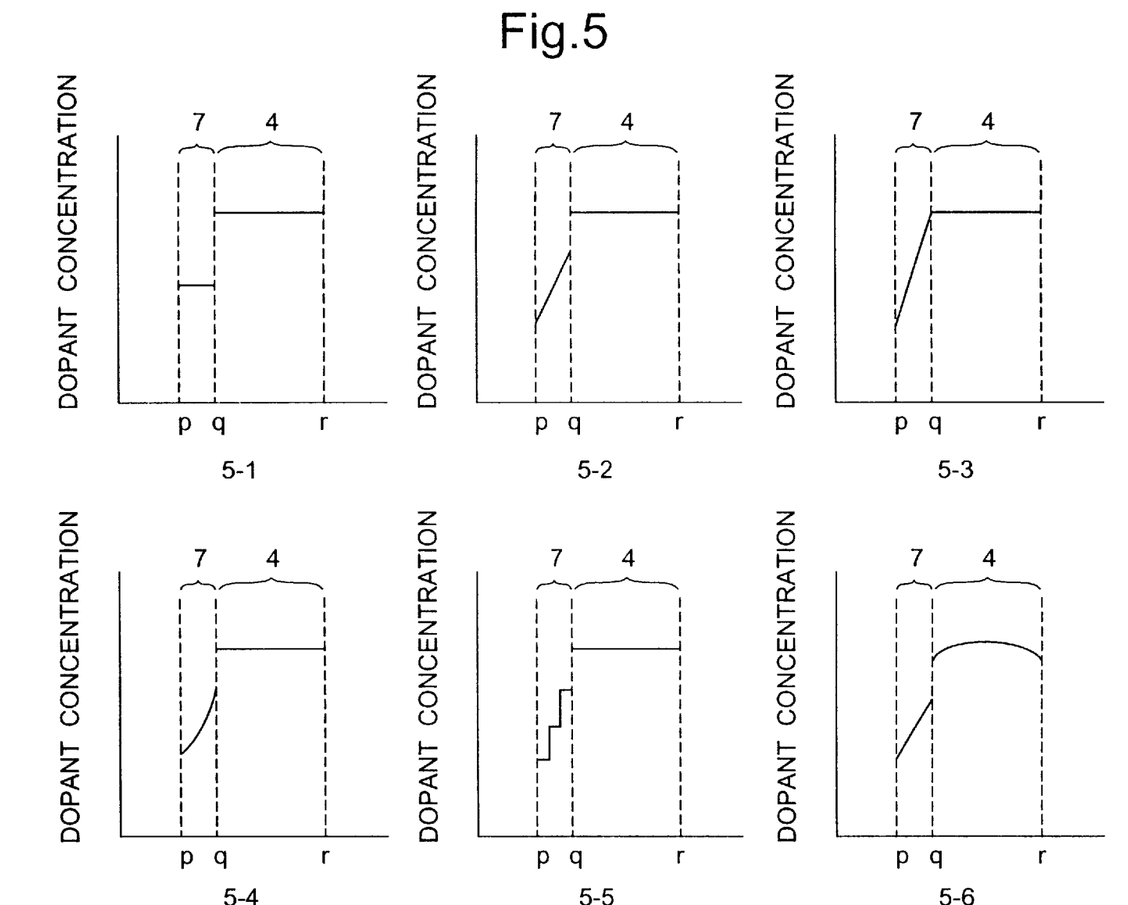
FIG. 5 is dopant concentration profile examples in a luminescent layer and a doped layer of the organic EL element according to the first embodiment of the present invention.

The following is an explanation about a dopant concentration profile in an organic EL layer. Some dopant concentration profiles in the first embodiment are shown in FIG.5 as one example. A dopant concentration in the doped layer 7 may be uniform as shown in FIG. 5-1. However, to provide a concentration profile such that the dopant concentration is increased as the dopant gets closer to the luminescent layer 4, as shown in FIG. 5-2, is more effective. That is, by providing such a concentration profile, the electron transport layer can emit light in the same color as that of the luminescent layer without lowering an electron injection efficiency in the electron transport layer. FIG. 5-2 shows a case where dopant concentrations are discontinued at the boundary between the doped layer 7 and the luminescent layer 4. However, the dopant concentration shown in FIG. 5-2 may be continued as shown in FIG. 5-3. Although the doped amounts of the doped layer 7 and the luminescent layer 4 are equalized in the boundary therebetween, the doped amount of the whole doped layer 7 is less than that of the whole luminescent layer 4. Further, a dopant concentration profile in the doped layer 7 is not necessarily linear, but it may be a non-linear as shown in FIG. 5-4, or a step-shaped line partially including a constant concentration region as shown in FIG. 5-5. Further, if a dopant concentration in the luminescent layer 4 is higher than a dopant concentration in the doped layer 7, it may not be uniform in the luminescent layer 4 as shown in FIG. 5-6. As a matter of course, the concentration profiles are not limited to these examples. Further, even the doped layer 8 formed in the hole transport layer 3b in the third embodiment can have the same dopant concentration profile as in the doped layer 7 formed in the electron transport layer 5a of the first embodiment so that a dopant concentration on the luminescent layer 4 side of the hole transport layer 3b may become higher. Further, the same dopant concentration profile can be obtained by providing a hole transport layer and an electron transport layer on both sides of the luminescent layer 4 so that the dopant concentration on the luminescent layer side becomes higher in the respective doped layers.

The materials of the hole transport layer, luminescent layer, electron transport layer, dopant, anode, cathode, and substrate used in the present invention, are not specifically limited, various materials which are generally used can be used. Further, according to the present invention, the hole transport layer can include a hole injection layer, and the electron transport layer can include an electron injection layer. In this case, the hole injection layer and the electron injection layer are respectively provided on the anode side of the hole transport layer and on the cathode side of the electron transport layer.

These organic EL elements mentioned above are mounted on, for example, an organic EL display to be used.

As described in detail, according to the present invention, since the same kind of dopant as that of the dopant in the luminescent layer is doped in the region, where at least one of the hole transport layer and the electron transport layer contacts the luminescent layer, in a lower concentration than the concentration in the luminescent layer, when a recombination between the hole and the electron is generated in at least one of the hole transport layer and the electron transport layer, luminescence is performed in a dopant-doped region. As a result, even if at least one of the electron and the hole penetrates the luminescent layer due to the relation of an applied voltage, the current efficiency is not lowered and the luminescence in at least one of the hole transport layer and the electron transport layer can be controlled. Thus, a change of a shade is stably controlled. That is, even if at least one of the hole transport layer and the electron transport layer emits light, it can emit light in the same color (single color tone) as the luminescent layer does without lowering the current efficiency.

What is claimed is:

1. An organic electroluminescent element comprising:
   a dopant-doped luminescent layer that emits light by a recombination between a hole and an electron;
   a hole transport layer that transports a hole supplied from an anode to said luminescent layer; and
   an electron transport layer that transports an electron supplied from a cathode to said luminescent layer,
   wherein the same kind of dopant as that of said dopant is doped in the region, where said hole transport layer contacts said luminescent layer, in a lower concentration than the concentration in said luminescent layer.

2. An organic electroluminescent element according to claim 1, wherein the thickness of the region where said hole transport layer contacts said luminescent layer is ⅔ or less of the thickness of said hole transport layer.

3. An organic electroluminescent element according to claim 2, wherein the dopant concentration in the region where said hole transport layer contacts said luminescent layer has a concentration gradient which is increased as the dopant gets closer to said luminescent layer.

4. An organic electroluminescent element according to claim 3, wherein said hole transport layer includes a hole injection layer.

5. An organic electroluminescent display on which an organic electroluminescent element according to claim 1 is mounted.

6. An organic electroluminescent element comprising:
   a dopant-doped luminescent layer that emits light by a recombination between a hole and an electron;
   a hole transport layer that transports a hole supplied from an anode to said luminescent layer; and
   an electron transport layer that transports an electron supplied from a cathode to said luminescent layer,
   wherein the same kind of dopant as that of said dopant is doped in the region, where said electron transport layer contacts said luminescent layer, in a lower concentration than the concentration in said luminescent layer.

7. An organic electroluminescent element according to claim 6, wherein the thickness of the region where said electron transport layer contacts said luminescent layer is ⅔ or less of the thickness of said electron transport layer.

8. An organic electroluminescent element according to claim 7, wherein the dopant concentration in the region where said electron transport layer contacts said luminescent layer has a concentration gradient which is increased as the dopant gets closer to said luminescent layer.

9. An organic electroluminescent element according to claim 8, wherein said electron transport layer includes an electron injection layer.

10. An organic electroluminescent display on which an organic electroluminescent element according to claim 6 mounted.

11. An organic electroluminescent element comprising:
    a dopant-doped luminescent layer that emits light by a recombination between a hole and an electron;
    a hole transport layer that transports a hole supplied from an anode to said luminescent layer; and
    an electron transport layer that transports an electron supplied from a cathode to said luminescent layer,
    wherein the same kind of dopant as that of said dopant is doped in both regions, where said hole transport layer and said electron transport layer respectively contact said luminescent layer, in a lower concentration than the concentration in said luminescent layer.

12. An organic electroluminescent element according to claim 11, wherein the respective thickness of both regions where said hole transport layer and said electron transport layer contact said luminescent layer are ⅔ or less of the respective thickness of said hole transport layer and said electron transport layer.

13. An organic electroluminescent element according to claim 12, wherein the respective dopant concentrations in both regions where said hole transport layer and said electron transport layer contact said luminescent layer have a concentration gradient which is increased as the dopant gets closer to said luminescent layer.

14. An organic electroluminescent element according to claim 13, wherein said hole transport layer includes a hole injection layer and said electron transport layer includes an electron injection layer.

15. An organic electroluminescent element according to claim 13, wherein said hole transport layer includes a hole injection layer or said electron transport layer includes an electron injection layer.

16. An organic electroluminescent display on which an organic electroluminescent element according to claim 11 is mounted.

17. A method of producing an organic electroluminescent element comprising the steps of:
    forming an anode;
    forming a hole transport layer that transports a hole supplied from an anode;
    forming a dopant-doped luminescent layer that emits light by a recombination between a hole transported from said hole transport layer and an electron transported from said electron transport layer;
    forming an electron transport layer that transports an electron supplied from a cathode to said luminescent layer, and
    forming a cathode,
    wherein said step of forming the hole transport layer includes a step of doping the same kind of dopant as that of said dopant in the region, where said hole transport layer contacts said luminescent layer, in a lower concentration than the concentration in said luminescent layer.

18. A method of producing an organic electroluminescent element according to claim 17, wherein in the step of doping the same kind of dopant as that of said dopant in the region, where said hole transport layer contacts said luminescent layer, in a lower concentration than the concentration in said luminescent layer, the thickness of the dopant-doped region in said hole transport layer is controlled to be 2/3 or less of the thickness of said hole transport layer by the rate of vapor deposition.

19. A method of producing an organic electroluminescent element according to claim 18, further comprising a step of vapor-depositing a dopant together with a hole transport material while controlling the dopant concentration by the rate of vapor deposition in the region where said hole transport layer contacts said luminescent layer so that the dopant concentration becomes higher as the dopant gets closer to said luminescent layer.

20. A method of producing an organic electroluminescent element comprising the steps of:
   forming an anode;
   forming a hole transport layer that transports a hole supplied from an anode;
   forming a dopant-doped luminescent layer that emits light by a recombination between a hole transported from said hole transport layer and an electron transported from said electron transport layer;
   forming an electron transport layer that transports an electron supplied from a cathode to said luminescent layer, and
   forming a cathode,
   wherein said step of forming the electron transport layer includes a step of doping the same kind of dopant as that of said dopant in the region, where said electron transport layer contacts said luminescent layer, in a lower concentration than the concentration in said luminescent layer.

21. A method of producing an organic electroluminescent element according to claim 20, wherein in the step of doping the same kind of dopant as that of said dopant in the region, where said electron transport layer contacts said luminescent layer, in a lower concentration than the concentration in said luminescent layer, the thickness of the dopant-doped region in said electron transport layer is controlled to be 2/3 or less of the thickness of said electron transport layer by the rate of vapor deposition.

22. A method of producing an organic electroluminescent element according to claim 21, further comprising a step of vapor-depositing a dopant together with an electron transport material while controlling the dopant concentration by the rate of vapor deposition in the region where said electron transport layer contacts said luminescent layer so that the dopant concentration becomes higher as the dopant gets closer to said luminescent layer.

23. A method of producing an organic electroluminescent element comprising the steps of:
   forming an anode;
   forming a hole transport layer that transports a hole supplied from an anode;
   forming a dopant-doped luminescent layer that emits light by a recombination between a hole transported from said hole transport layer and an electron transported from said electron transport layer;
   forming an electron transport layer that transports an electron supplied from a cathode to said luminescent layer, and
   forming a cathode,
   wherein said steps of forming the hole transport layer and said electron transport layer includes a step of doping the same kind of dopant as that of said dopant in both regions, where said hole transport layer and said electron transport layer contact said luminescent layer, in a lower concentration than the concentration in said luminescent layer.

24. A method of producing an organic electroluminescent element according to claim 23, wherein in the step of doping the same kind of dopant as that of said dopant, in both regions where said hole transport layer and said electron transport layer contact said luminescent layer, in a lower concentration than the concentration in said luminescent layer, the respective thickness of both dopant-doped regions in said hole transport layer and electron transport layer are controlled to be 2/3 or less of the respective thickness of said hole transport layer and electron transport layer by the rate of vapor deposition.

25. A method of producing an organic electroluminescent element according to claim 24, further comprising a step of vapor-depositing a dopant together with a hole transport material and together with an electron transport material while controlling the dopant concentrations by the rate of vapor deposition in both regions where said hole transport layer and said electron transport layer contact said luminescent layer so that the dopant concentrations become higher as the dopant gets closer to said luminescent layer.

* * * * *